Aug. 9, 1966 S. L. BROADHEAD, JR 3,265,976

COMBINED FREQUENCY AND PHASE DISCRIMINATOR

Filed Feb. 24, 1964 2 Sheets-Sheet 1

INVENTOR.
SAMUEL L. BROADHEAD JR.
BY
Moody and Kintzinger
ATTORNEYS

OUTPUT WHEN DIFFERENCE OF $f_1$ $f_2$ IS TOO LOW FOR OUTPUT SIGNAL PEAK INTEGRATOR TO OPERATE

INVENTOR.
SAMUEL L. BROADHEAD JR.
BY
Moody and Kintzinger
ATTORNEYS

United States Patent Office 3,265,976
Patented August 9, 1966

3,265,976
COMBINED FREQUENCY AND PHASE DISCRIMINATOR

Samuel L. Broadhead, Jr., Cedar Rapids, Iowa, assignor to Collins Radio Company, Cedar Rapids, Iowa, a corporation of Iowa Filed Feb. 24, 1964, Ser. No. 346,614
15 Claims. (Cl. 329—137)

Figure 1:
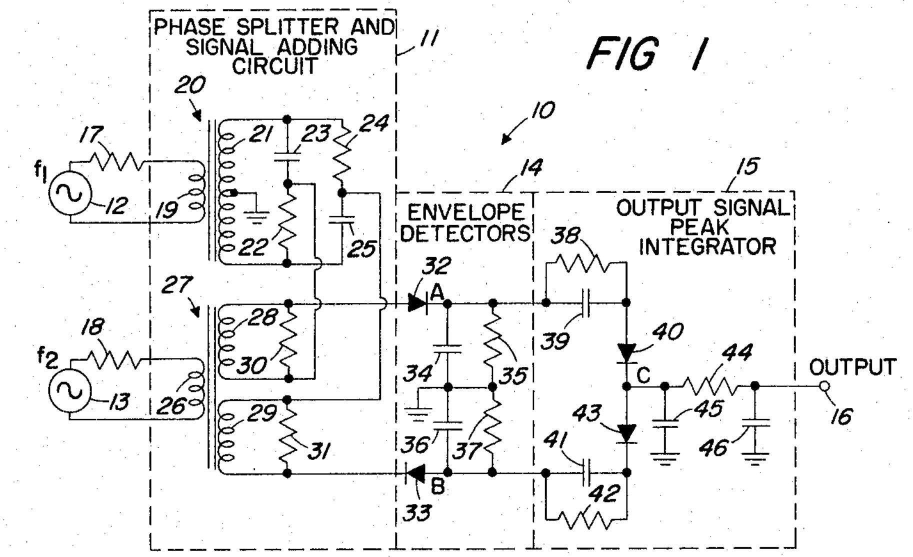

This invention relates in general to frequency discriminator circuits and to phase discriminator circuits, and in particular to a combined frequency and phase discriminator circuit capable of providing output voltages with a variable frequency input over a considerable frequency range from a reference frequency, and phase discriminator output voltages when the variable frequency input is within a relatively few kilocycles per second of the reference frequency.

With stabilized master oscillator systems, the use of a phase discriminator alone generally will not effect phase capture if the master oscillator frequency error is more than a few kilocycles per second. Furthermore, frequency discriminators alone, with frequency errors within a few kilocycles per second, generally do not develop corrective voltage output levels required to insure frequency lock. A further limitation of some frequency discriminators using tuned circuits is a restricted corrective range inherent with the frequency characteristics of the tuned circuits used to derive a frequency discriminator output. Another problem is that many phase and/or frequency discriminators are not symmetrical about a zero or ground reference and are plagued with troublesome excursions of oscillator frequency immediately after turn-on.

It is, therefore, a principal object of this invention to provide an improved combined frequency and phase discriminator providing an error voltage based on the difference between a variable frequency input signal and a reference frequency signal and also providing a phase error voltage when the frequency error range is relatively small. Such frequency error output voltages and phase error output voltages are particularly useful, for example, in shifting a variable frequency oscillator toward the reference frequency and achieving phase capture.

Another object is to provide a combination frequency and phase discriminator providing useful error output voltages throughout extended variable frequency input excursions relative to a reference frequency.

A further object is for the error output voltages of the combined frequency-phase discriminator to be symmetrical about ground zero or other voltage reference as desired.

Features of this invention useful in accomplishing the above objects include, in a combined frequency and phase discriminator, a phase splitter and signal adding circuit section receiving a variable frequency input and a fixed frequency input, a signal envelope detector portion, and an output signal peak integrator section. One of the frequency signal inputs is fed through a transformer coupling to a center voltage referenced secondary coil, the opposite ends of which are connected to feed respective phase shift networks producing phase shifts between the two phases from about 60° to 120°. The other frequency signal input is coupled through a transformer to two secondary coils which are connected in opposite polarities to receive the outputs of the phase shift networks associated with the other signal transmitting transformer. This provides a signal additive action and, with the opposite polarity secondary coil connections, substantially eliminates unbalance likely otherwise to be caused by distortion of one of the frequency input waveforms.

When the two inputs are at the same frequency, the envelope detector circuit acts as a conventional phase discriminator providing, as outputs from the two detectors, a positive D.-C. and a negative D.-C. rectification which effectively cancel to zero at the discriminator output. When there is a frequency difference between the inputs, a D.-C. frequency difference output is provided out of the discriminator which is plus or minus depending upon which input is the higher frequency input. When the frequency difference amounts to only a few kilocycles per second, the A.-C. phase difference output is superimposed upon the D.-C. frequency difference output. After a frequency error correction to within a few kilocycles, phase derived voltage may be used to swing a voltage controlled master oscillator error to zero, achieving phase capture and frequency lock.

When the two inputs differ in frequency the two diodes of the envelope detector section serve as detectors, each developing the difference frequency as an output with each output being at the same frequency but differing in phase by phase difference of the referenced frequency components developed in the phase shift networks of the phase splitter. For the steady state condition, two resistance-capacitive biasing networks receiving the output of the envelope detector diodes, bias two additional diodes connected therebetween to provide a rectified output of the positive peaks of the one difference envelope at the common junction and the negative peaks of the other difference envelope at the common junction. If one of the input frequencies is higher than the other input frequency, the output from one of the envelope detectors will lead the output from the other of the envelope detectors by about 60° to 120° and will pass a signal of the appropriate polarity through the associated diode in the output signal peak integrator, approximately one fourth in time ahead of the opposite polarity signal passed through the other diode. These opposite polarity signals passed through the diodes correspondingly charge capacitive means connected to the common junction of the two output signal developing diodes of the output signal peak integrator. This results in one polarity charge existing approximately one fourth of the time and the other polarity charge existing approximately three fourths of the time, thereby giving a net effective output of the voltage polarity having the greater signal charge retention time. A capacitor of the capacitive means may be chosen for operation in the range of approximately 10 kc. to 400 kc. signal frequency difference, and a diode-capactive-resistance network may also be added to extend this freqeuency error correction down to about 500 cycles per second.

Specific embodiments representing what are presently regarded as the best modes of carrying out the invention are illustrated in the accompanying drawings.

Figure 2:
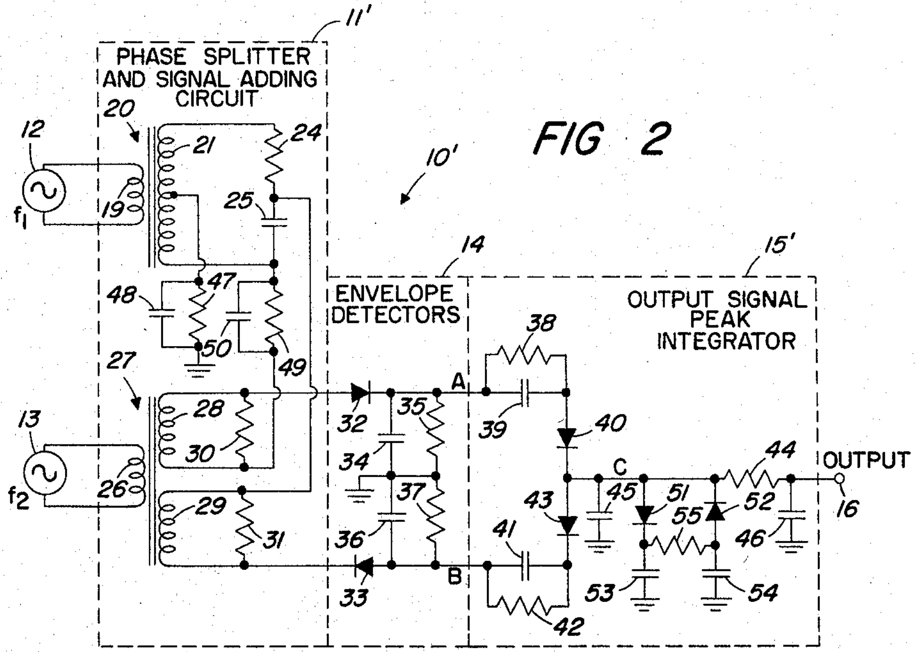
Figure 3:
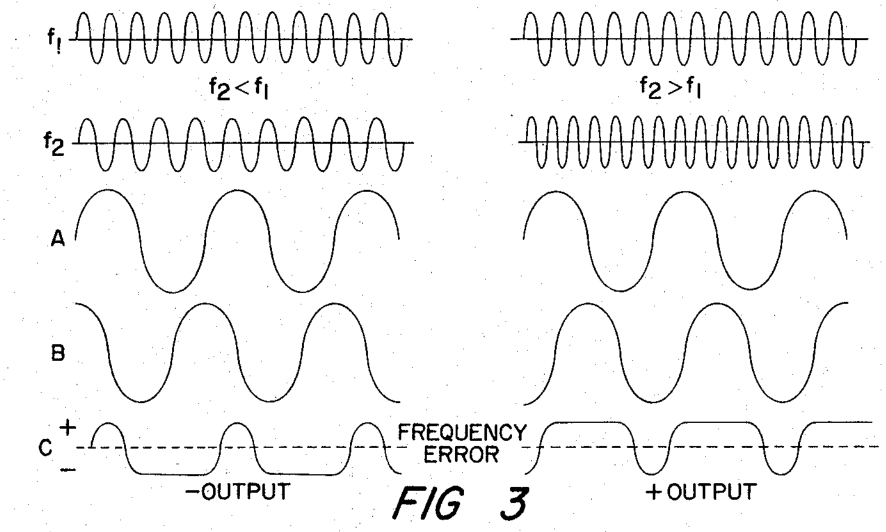
Figure 4:
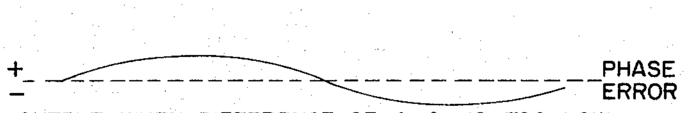
Figure 5:
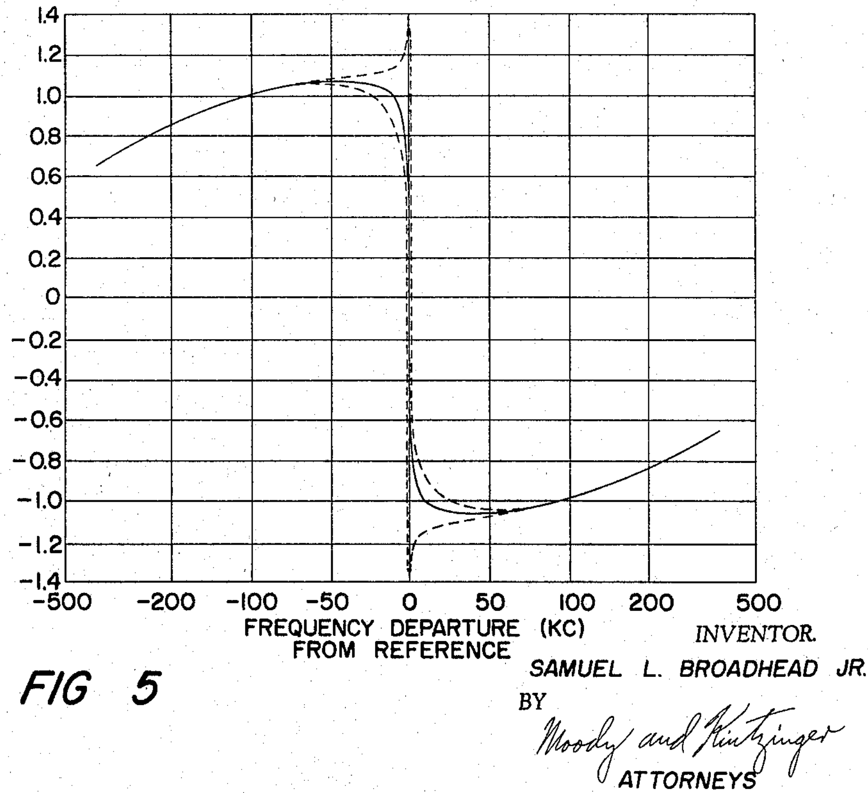

In the drawings:

FIGURE 1 represents a combined frequency and phase discriminator according to the invention;

FIGURE 2, a combination frequency and phase discriminator similar in many respects to the embodiment of FIGURE 1, with additional features;

FIGURE 3, a family of curves developed at various points in the combination frequency and phase discriminator for frequency differences, one family of curves with one frequency being higher than the other, and the other family of curves with the other input being the higher frequency input;

FIGURE 4, a typical voltage output curve developed when the frequency difference between the two inputs is too low for the output signal peak integrator to operate; and FIGURE 5, the combined frequency and phase discriminator output curve of the effective D.-C. voltage developed through the ranges of frequency differences above and below the reference frequency input, and the A.-C.

phase difference output developed superimposed upon the D.-C. frequency difference output as the variable frequency approaches the reference frequency, and the phase difference voltages developed when the frequencies are equal.

Referring to the drawings:

The combined frequency and phase discriminator 10 of FIGURE 1 has a phase splitter and signal adding circuit section 11 adapted for receiving two frequency input signals $f_1$ and $f_2$ from signal sources 12 and 13, respectively. The envelope detectors section 14 receives signals from the phase splitter and signal adding circuit section 11 and passes outputs to the output signal peak integrator 15 for developing an output at terminal 16. The resistors 17 and 18 in the input frequency generator circuits may be considered to represent internal resistance within the generators in addition to any resistance in the input signal circuits.

Frequency generator 12 is connected to the primary coil 19 of a transformer 20 having a center tapped and grounded secondary coil 21. Two phase shift networks, each including a resistor and a capacitor, are connected between opposite ends of secondary coil 21. The resistor 22 and the capacitor 23 of one of the phase shift networks and the resistor 24 and capacitor 25 of the other phase shift network are connected in reverse orientation to opposite terminals of the secondary coil 21.

Frequency generating source 13 is connected to primary coil 26 of a secondary transformer 27 of the phase splitter and signal adding circuit 11. The two secondary coils 28 and 29 of transformer 27 have resistors 30 and 31 connected across their output terminals, respectively. The common junction of resistor 22 and capacitor 23 of one of the phase shift networks operating on the output of transformer 20 is connected to a terminal of coil 28, and, in like manner, the common junction of resistor 24 and capacitor 25 of the other phase shift network is connected to a terminal of secondary coil 29. It should be noted that the secondary coils 28 and 29 are connected in opposite polarities to prevent unbalance which may be caused by distortion of the frequency input $f_2$ from frequency source 13. The other terminals of secondary coils 28 and 29 are connected to the anode of diode 32 and the cathode of diode 33, respectively, in envelope detectors section 14.

In the emobdiment of FIGURE 1, frequency $f_1$ from the frequency source 12 is considered the reference frequency and frequency $f_2$ from frequency source 13 as the variable frequency, although it could just as well be the other way with the limitation that the signal input from frequency source 12 must be substantially sinusoidal for proper operation of the phase shift networks. Furthermore, the signal input from frequency source 13 may be sinusoidal or, if desired, in the form of pulses not exceeding approximately 30° in width, and with these pulses positive as applied out of secondary coil 28 to diode 32 and negative out of secondary coil 29 as applied to diode 33. The cathode of diode 32 is connected through capacitor 34 and resistor 35, in parallel, to ground, and also as in input connection to output signal peak integrator 15. The anode of diode 33 is connected through capacitor 36 and resistor 37, in parallel, to ground, and also as an input connection to output signal peak integrator 15.

The diode 32 cathode output of the envelope detectors section 14 is connected through resistor 38 and capacitor 39, in parallel, to the anode of diode 40. The diode 33 anode output of the envelope detectors section 14 is connected through resistor 42 and capacitor 41, in parallel, to the cathode of diode 43. The common output junction of diodes 40 and 43 is connected through resistor 44 to the output terminal 16 and through capacitor 45 to ground. The output terminal 16 side of resistor 44 is also connected through a capacitor 46 to ground.

In operation, the phase shift networks out of secondary coil 21 produce a phase difference between phase 1 and phase 2 of the frequency input $f_1$ from frequency source 12 of about 60° to 120°. One of these phases is added to frequency $f_2$ out of frequency source 13 in coil 28 in an additive action and applied to diode 32. The other phase is, in like manner, added to $f_2$ in coil 29 and applied to diode 33. With a frequency input $f_1$ from frequency source 12 of somewhere between 1 and 1.5 megacycles and a variable frequency $f_2$ input having a frequency difference from a few kilocycles, for example, 5 kilocycles up to approximately 400 kilocycles, the rectified peak voltage envelopes on the output sides of diodes 32 and 33 will differ in phase by the phase difference developed in the phase shift networks, approximately 60° to 120°. The parallel resistor and capacitor connections 38 and 39, and 41 and 42 between diodes 32 and 40, and 33 and 43, respectively, act as bias networks causing the diodes 40 and 43 to conduct only envelope peaks of the respective polarities such as to charge the capacitor 45 first one polarity and then the other polarity.

The polarity and magnitude of the effective frequency difference derived D.-C. output voltage is determined by such factors as the relative lengths of time between reverse chargings of capacitor 45. Thus, the brief D.-C. charging currents of positive polarity passed by diode 40 and the brief D.C. charging currents of negative polarity passed by diode 43 are spaced as determined by the phase shift developed in the phase shift networks, acting on the frequency $f_1$ input from frequency source 12. The time spacing, for example, may be approximately one fourth of the time from the charging of one polarity to the charging of the other polarity and approximately three fourths time spacing to the next reverse charging D.C. current flow, with the portions of time apportioned to the negative and the positive D.-C. voltage potentials as determined by which frequency input, $f_1$ or $f_2$, is the higher frequency. Obviously, the various circuit connections within the combined frequency and phase discriminator are such that the developed output voltages are of desired polarity for correcting the frequency, for example, of a voltage controlled master oscillator. Frequency difference developed output voltages could be reversed, for example, by connecting the output from coil 28 to the cathode of diode 33 and the output of coil 29 to the anode of diode 32 if both inputs are sinusoidal or other requirements met, or by reversing the connections between the phase shift networks and coils 28 and 29. Another obvious way of accomplishing the same reversal of polarity output would be to interchange the frequency inputs, subject to the requirements pointed out hereinbefore with respect to a sinusoidal input to coil 19 and the input to coil 26 if in the form of pulses being not more than approximately 30° in width.

As the frequency difference is being corrected toward the chosen reference frequency, phase error developed A.-C. voltages, starting from the frequency difference of approximately 75 kc. off-frequency, becomes superimposed upon the frequency difference developed effective D.-C. voltages and becomes predominately effective from approximately 10 kc. off-frequency in the phase discriminator developed output voltage to be capable of drawing a voltage controlled master oscillator to phase lock with the reference frequency. With a capacitor 45 chosen to provide useable frequency error developed effective D.-C. outputs up to about 400 kc. frequency difference, the phase error developed A.-C. voltages become effective within a 10 kc. frequency difference, and the phase error derived A.-C. voltages are particularly effective within ±2 kc. of the reference frequency. This results in an error A.-C. output voltage at the difference between the frequencies when this difference frequency is too low for the envelope peak time integrator to operate. In this region of operation, the combination frequency and phase discriminator is substantially conventional as a phase discriminator through the envelope detectors section 14 with the relatively low frequency A.-C. output developed being passed through the output signal peak integrator circuitry to output terminal 16 with substantially no signal integrating effect. Then, when the two frequencies become phase locked, the phase error developed output voltage changes only as needed, for example, to correct an oscillator against transients tending to change oscillator frequency.

In the embodiment of FIGURE 2, except for several changes and additions, components similar to those of the embodiment of FIGURE 1 are, for the sake of convenience, numbered the same. In the combined frequency and phase discriminator 10' of FIGURE 2, a resistor 47 and capacitor 48 are connected in parallel between the center tap of secondary coil 21 and ground. With this addition, which could also be included in the embodiment of FIGURE 1, the phase discriminator output voltages may be attenuated to substantially a range of output voltage levels compatible to the range of frequency discriminator output voltages by selecting the value of resistor 47 for desired resistant ratio to the value of resistors 35 and 37. Since capacitor 48 is provided to bypass the frequency difference envelope from the center tap of coil 21 to ground, the adjustment of the resistance ratio does not appreciably affect the development of frequency discriminator output voltages if source impedances are much less than the impedance of resistors 35 and 37 and if the value of resistor 44 is much greater than resistor 47.

The resistor 22 and capacitor 23 phase shift network of FIGURE 1 is replaced in the phase splitter and signal adding circuit 11' of the embodiment of FIGURE 2 by a phase shift network of resistor 49 and capacitor 50 connected in parallel between the junction of one end of coil 21 and capacitor 25 and an end of coil 28. This somewhat different phase shift network provides the same end desired results as the other type and could be utilized in place of either of the phase shift networks of the embodiment of FIGURE 1.

While the envelope detectors section 14 in the embodiment of FIGURE 2 is the same as in FIGURE 1, a low frequency difference error correction extending diode-capacitive-resistance network is added to the output signal peak integrator 15'. This added low frequency difference error correction network includes two diodes 51 and 52, series connected from the common output junction of diodes 40 and 43 through capacitors 53 and 54, respectively, to ground. The anode of diode 51 and the cathode of diode 52 is connected to the common junction of diodes 40 and 43, and a resistor 55 interconnects the common junction of diode 51 and capacitor 53 with the common junction of diode 52 and capacitor 54.

Frequency difference error voltages are generated by the charging of capacitor 45 in the embodiment of FIGURE 1, first one polarity and then the other and in the embodiment of FIGURE 2, by the charging of capacitors 45, 53 and 54, first one polarity and then the other. The difference in the length of time that the capacitor, or capacitors, stay charged in each polarity determines the polarity of the effective frequency difference developed output voltage. It should be noted that a single capacitor 45, as in the embodiment of FIGURE 1, large enough to hold a charge between pulses at a relatively low frequency difference, such as a 500 c.p.s. difference, with a reasonable resistive load in resistor 44 of approximately 100K, would be too large to be charged sufficiently through a reasonable circuit source impedance by charging pulses at the higher frequency differences approaching 400 kc. This problem is overcome with the added low frequency difference error correction network in FIGURE 2 including the capacitors 53 and 54, diodes 51 and 52, and resistor 55. This permits the use of a capacitor 45 value that will operate up to the highest desired frequency difference, even as high as 400 kc. Capacitors 53 and 54, however, are chosen for operation down to the lowest desired frequency difference, for example, 500 c.p.s. The resistor 55 is so chosen as to provide the desired time constant in maintaining charges on the capacitors 53 and 54 in the proper proportion to the frequency difference and frequency of charge and discharge. At the higher end of the frequency difference range, negligible charging current flows through diodes 51 and 52 between charging pulses while at the lower end of the frequency range nearly all of the charges on capacitors 53 and 54 flow into the output circuit. Thus, between the lower and higher ends of the effective frequency difference range the capacitors 53 and 54 are gradually effectively disconnected as the frequency equal to the frequency difference between the input frequencies is increased. This greatly extends the range of frequency difference error correction over that obtainable with a single capacitor 45 as in FIGURE 1. In the embodiment of FIGURE 1, a capacitor 45 of 100 micromicrofarads used alone provides a useable frequency difference error output from about 400 kc. to about 10 kc. frequency difference between the input frequencies, while in the embodiment of FIGURE 2 the addition of diodes 51 and 52, capacitors 53 and 54, and resistor 55 beneficially extends the useable frequency difference effective error voltage output developed down to a frequency difference of approximately 500 c.p.s.

The description of operation hereinbefore provided with respect to the embodiment of FIGURE 1 is, generally speaking, applicable to the embodiment of FIGURE 2 and is not, therefore, repeated in its entirety here. One of the differences is that, with the embodiment of FIGURE 2, the phase error developed A.-C. voltage would not be required to be and would not be as predominately effective over as widely an extended range as with the embodiment of FIGURE 1. With the embodiment of FIGURE 2, the phase error derived A.-C. voltages are effective from approximately ±2 kc. input frequency difference and become particularly effective from approximately ±500 c.p.s. down to zero frequency difference in providing the phase difference derived error voltage output. This, of course, is an alternating voltage having a frequency equal to the frequency difference between the input frequencies, if a difference does in fact exist, and is a D.-C. voltage dependent upon phase difference if the input frequencies are equal.

In referring to FIGURE 3, one views a family of curves for the condition of $f_1$ being greater than $f_2$ and a family of curves for the condition of $f_2$ being greater than $f_1$, as indicated, showing the frequency difference envelopes out of detectors 32 and 33 at points A and B, respectively, as they appear in both the FIGURE 1 and 2 embodiments. The effective D.-C. voltage output waveform developed at point C in both embodiments is shown with operation within the limits of effective frequency difference output error voltage development.

Reference to FIGURE 4 illustrates a typical A.-C. voltage output curve developed during operation in the range of frequency differences where the phase error developed voltages predominate at the output while the difference of the input frequencies $f_1$ and $f_2$ is too low for the envelope output signal peak integrator to operate in developing significant voltages. This A.-C. voltage, as has been pointed out, is at a frequency equal to the frequency difference as long as a frequency difference exists at low differences between the input frequencies, and until a frequency difference does not exist. Then, the phase discriminator derived voltage is solely dependent upon the phase difference between the equal frequency input signals.

Referring to the combined frequency and phase discriminator output curve of FIGURE 5, the effective D.-C. voltages developed through the ranges of frequency differences above and below the reference frequency input are shown as solid lines extending from a plus and minus frequency difference as high as approximately 400 kc. down to frequency differences of approximately 500 c.p.s. The phase difference output developed voltages are shown as dotted lines defining the limits of A.-C. superimposed upon the frequency difference developed effective D.-C. voltages with frequency differences decreasing from approximately 75 kc. to points within approximately ±2 kc. of the reference frequency. Within approximately the ±2 kc. frequency difference limits, the phase error developed voltage becomes substantially a plus and minus A.-C. voltage, more one polarity than the other depending on which input frequency is the higher frequency, and with the outer limits of polarity excursions approaching a balanced state as the frequency difference approaches zero.

Components and values used in a combined frequency and phase discriminator according to the embodiment of FIGURE 2, providing the operational results outlined therefor, developing the voltage curves of FIGURE 3, and the phase error voltage output curve of FIGURE 4, under the conditions set forth, include the following:

| | | |
|---|---|---|
| Resistors **24** and **49** | ohms | 680 |
| Capacitors **25** and **30** | picofarads | 200 |
| Resistors **30** and **31** | ohm | 1K |
| Diodes **32**, **33**, **40**, **43**, **51** and **52** | | 1N916 |
| Cacapitors **34** and **36** | picofarads | 22 |
| Resistors **35**, **37**, **38**, **42**, and **55** | ohms | 47K |
| Capacitors **39**, **41** and **48** | microfarads | 1 |
| Resistor **44** | ohms | 100K |
| Capacitor **45** | picofarads | 100 |
| Capacitors **46**, **53** and **54** | do | 1000 |
| Resistor **47** | ohms | 220K |

Thus, it may be seen that this invention provides a very effective combined frequency and phase discriminator capable of providing useful error output voltages throughout extended input frequency difference excursions and phase error derived output voltages when one input frequency is within a relatively few kc. per second of the other input frequency. It is a combined frequency and phase discriminator that may be connected to a ground reference, or another voltage reference as desired, so as to provide error output voltages symmetrical about ground or any other particular voltage reference selected.

Whereas this invention is here illustrated and described with respect to several embodiments thereof, it should be realized that various changes may be made without departing from the essential contributions to the art made by the teachings hereof.

I claim:

1. A combined frequency and phase discriminator circuit connected to receive a first frequency input signal from a first signal source and a second frequency input signal from a second signal source for developing frequency difference output voltages and/or phase discriminator output voltages through the frequency difference, phase error, and overlapping ranges of discriminator operation and including: a first transformer and a second transformer having primary coils connected to receive said first frequency input signal and said second frequency input signal, respectively; said first transformer having a center tapped secondary coil with the center tap connected to a voltage potential reference; phase shift circuit means, including circuit means interconnecting opposite ends of said center tapped secondary coil, capable of producing a signal phase shift in the range of approximately 60° to 120° in two output circuit line means from said center tapped secondary coil; said second transformer being equipped with two secondary coils, with each of the secondary coils having independent resistive means connected between opposite coil terminals; one terminal of each of the secondary coils of said second transformer being connected to one of the two output line means from the center tapped secondary coil of said first transformer; the other terminals of the two secondary coils of the second transformer being connected to a signal envelope detector portion having two output connections to an output signal peak integrator section; said output signal peak integrator section including a frequency signal biasing network between each output from the signal envelope detector portion and two diodes connected cathode to anode between the two frequency signal biasing networks; and the common junction of said diodes being connected through capacitive circuit means to a voltage potential reference source and through resistive means to an output terminal.

2. The combined frequency and phase discriminator circuit of claim 1, wherein said signal envelope detector portion includes: two diode rectifiers, one having an anode connection with a terminal of one coil of the secondary coils of the second transformer and the other diode rectifier having a cathode connection with a terminal of the other secondary coil of the second transformer; and a parallel capacitor and resistor network connected between the output electrode of each of the envelope detector diode rectifiers and a voltage potential reference source; and with the output electrodes of the two envelope detector diodes being common to the respective output connections to said output signal peak integrator section.

3. The combined frequency and phase discriminator circuit of claim 1, wherein said phase shift circuit means includes two capacitive-resistive networks interconnected to opposite ends of said center tapped secondary coil.

4. The combined frequency and phase discriminator circuit of claim 1, wherein the phase shift circuit means interconnecting the opposite ends of said center tapped secondary coil is a capacitive-resistive phase shift network; and wherein an additional phase shift network is included in one of the two output circuit line means from said center tapped secondary coil.

5. The combined frequency and phase discriminator circuit of claim 1, wherein a parallel resistive-capacitive network is included between the center tap of said secondary coil and the voltage potential reference source.

6. The combined frequency and phase discriminator circuit of claim 1, wherein the two secondary coils of the second transformer are connected in opposite polarity to the output circuit line means from the center tapped secondary coil of the first transformer.

7. The combined frequency and phase discriminator circuit of claim 1, wherein a diode-capacitive-resistance network is included in said capacitive circuit means between the common junction of the diodes of the signal envelope detector portion and the voltage potential reference source.

8. The combined frequency and phase discriminator circuit of claim 7, wherein said diode-capacitive-resistance network includes two additional diodes series connected from the common junction between the two diodes of the output signal peak integrator section through two capacitors, respectively, to ground, with the anode of one of the diodes and the cathode of the other diode of the diode-capacitive-resistance network connected to said common junction; and resistive means interconnects the junction between one diode and a capacitor and the junction of the other diode and a capacitor in said diode-capacitive-resistance network.

9. The combined frequency and phase discriminator circuit of claim 1, wherein each of said frequency signal biasing networks includes a resistor and capacitor in parallel.

10. A combined frequency and phase discriminator circuit connected to receive a first frequency input signal from a first signal source and a second frequency input signal from a second signal source for developing frequency difference output voltages and/or phase discriminator output voltages through the frequency difference, phase error, and overlapping ranges of discriminator operation, and including: first frequency input signal coupling means; dual output means from said first frequency input signal coupling means; means imparting a phase shift in the signal outputs transmitted to said dual output means; second frequency input signal coupling means; said second frequency input signal coupling means having dual secondary coupling elements with one of said dual coupling elements connected to receive a signal from one of said dual output means of the first signal coupling means, and the other secondary coupling element being connected to receive a signal from the other of said dual output means; each of said secondary coupling elements also being connected to a signal envelope detector portion; said signal envelope detector portion having two output connections to an output signal peak integrator section; said output signal peak integrator section including a frequency signal biasing network between each output from the signal envelope detector portion and two diodes connected cathode to anode between the two frequency signal biasing networks; and the common junction of said diodes being connected through capacitive circuit means to a voltage potential reference source and through resistive means to an output terminal.

11. The combined frequency and phase discriminator circuit of claim 10, wherein said signal envelope detector portion includes: two diode rectifiers, one having an anode connection with one of said secondary coupling elements and the other diode rectifier having a cathode connection with the other one of said secondary coupling elements; and a parallel capacitor and resistor network connected between the output electrode of each of the envelope detector diode rectifiers and a voltage potential reference source; and with the output electrodes of the two envelope detector diodes being common to the respective output connections to said output signal peak integrator section.

12. The combined frequency and phase discriminator circuit of claim 10, wherein said phase shift circuit means includes two capacitive-resistive networks.

13. The combined frequency and phase discriminator circuit of claim 10, wherein a diode-capacitive-resistance network is included in said capacitive circuit means between the common junction of the diodes of the signal envelope detector portion and the voltage potential reference source.

14. The combined frequency and phase discriminator circuit of claim 13, wherein said diode-capacitive-resistance network includes two additional diodes series connected from the common junction between the two diodes of the output signal peak integrator section through two capacitors, respectively, to ground, with the anode of one of the diodes and the cathode of the other diode of the diode-capacitive-resistance network connected to said common junction; and resistive means interconnects the junction between one diode and a capacitor and the junction of the other diode and a capacitor in said diode-capacitive-resistance network.

15. The combined frequency and phase discriminator circuit of claim 10, wherein each of said frequency signal biasing networks includes a resistor and capacitor in parallel.

References Cited by the Examiner

UNITED STATES PATENTS

| | | | |
|---|---|---|---|
| 2,476,804 | 7/1949 | Boykin ---------- | 329—138 X |
| 2,658,996 | 11/1953 | Lehde ----------- | 329—137 X |
| 2,703,380 | 3/1955 | Fraser ----------- | 328—133 X |

ROY LAKE, *Primary Examiner.*

A. L. BRODY, *Assistant Examiner.*